United States Patent [19]

Chism

[11] Patent Number: 4,947,106
[45] Date of Patent: * Aug. 7, 1990

[54] PROGRAMMATICALLY GENERATED IN-CIRCUIT TEST OF ANALOG TO DIGITAL CONVERTERS

[75] Inventor: Wayne R. Chism, Greeley, Colo.

[73] Assignee: Hewlett-Packard Company, Palo Alto, Calif.

[*] Notice: The portion of the term of this patent subsequent to Dec. 19, 2006 has been disclaimed.

[21] Appl. No.: 175,874

[22] Filed: Mar. 31, 1988

[51] Int. Cl.$^5$ .................. G01R 15/12; H03M 1/10; G06F 11/22

[52] U.S. Cl. .................................. 324/73.1; 341/120; 371/22.4

[58] Field of Search ........... 324/73 R, 73 AT, 73 PC, 324/158 R, 158 F, 130; 341/120, 121; 371/20, 25; 364/200

[56] References Cited

U.S. PATENT DOCUMENTS

| | | | |
|---|---|---|---|
| 3,872,491 | 3/1975 | Caslow | 324/73 R X |
| 4,092,589 | 5/1978 | Chau et al. | 324/73 R |
| 4,222,107 | 9/1980 | Mrozowski et al. | 364/571 |
| 4,266,292 | 5/1981 | Regan et al. | 370/13 |
| 4,340,856 | 7/1982 | Orlandi | 341/120 X |
| 4,425,561 | 1/1984 | Whiteside et al. | 340/347 |
| 4,497,056 | 1/1985 | Sugamori | 324/73 R X |
| 4,580,126 | 4/1986 | Kato et al. | 341/120 |
| 4,591,828 | 5/1986 | Storey | 340/347 |
| 4,698,588 | 10/1987 | Hwang et al. | 324/73 R |
| 4,710,747 | 12/1987 | Holland | 341/120 |
| 4,711,024 | 12/1987 | Russell | 29/832 |
| 4,724,380 | 2/1988 | Burrows et al. | 324/73 R |
| 4,733,167 | 3/1988 | Tamamura | 324/73 R |
| 4,743,841 | 5/1988 | Takeuchi | 324/73 R |
| 4,748,403 | 5/1988 | Tamamura | 324/73 R |
| 4,754,215 | 6/1988 | Kawai | 324/73 R |
| 4,758,781 | 7/1988 | Ueno et al. | 324/73.1 |
| 4,888,548 | 12/1989 | Chism | 324/73 R |

OTHER PUBLICATIONS

Sellier, "Analog-to-Digital Converter Automatic Tester", *IBM/TDB*, vol. 22, No. 3, Aug. 1979, pp. 1039-1040.

Buhler et al., "Analog-to-Digital Converter Checking Circuit", *IBM/TDB*, vol. 22, No. 8B, Jan., 1980, pp. 3618-3619.

Kinberg et al., "Calibrated Analog-to-Digital Converter", *IBM/TDB*, vol. 9, No. 11, Apr. 1967, pp. 1537-1538.

*Primary Examiner*—Reinhard J. Eisenzopf
*Assistant Examiner*—Warren S. Edmonds

[57] ABSTRACT

A device and process for programmatically controlled in-circuit pin checks and gross functionality tests of analog to digital converters. The tests provide deterministic bit checks for higher order bits and non-deterministic bit checks of lower order bits independent of other circuitry on the printed circuit board of which the digital to analog converter is a component.

13 Claims, 6 Drawing Sheets

PROGRAMMATICALLY GENERATED IN-CIRCUIT TEST OF ANALOG TO DIGITAL CONVERTERS

BACKGROUND OF THE INVENTION a. field invention

This invention pertains generally to the in-circuit functionality testing of hybrid circuit components, i.e., those having both analog and digital input/output ports and more specifically to a device and procedure to provide for in-circuit measurement and testing of general purpose analog to digital converters.

b. description of the background

For this invention, in-circuit test or measurement refers to a printed circuit board test procedure which, through the use of various isolation techniques, performs "pin checks" or "gross functionality tests" on individual board components regardless of the specific circuit configuration or the effects of surrounding circuitry. "Pin checks" are tests specially designed to verify appropriate electrical activity on all device pins (the physical connections to the devices). "Gross functionality tests" are more comprehensive than pin checks and refer to tests designed to verify the basic function of the part in addition to simply verifying pin activity. Neither test provides full functionality testing of component specifications.

The proliferation of "hybrid" electronic components, i.e. integrated circuits incorporating both analog and digital functions in their design, has rendered standard fault detection techniques obsolete, and has created manufacturing and quality control problems for printed circuit board assemblies utilizing these devices. Central to this problem are the class of components known as converters, of which there are two basic types. The digital to analog converter (D/A) converts a digital input signal to an analog output signal, and the analog to digital converter (A/D) converts an analog input signal to a digital output signal. Neither conventional analog or digital in-circuit test techniques alone suffice as a means of performing a comprehensive in-circuit functionality test of these hybrid components. As a result, printed circuit board assemblies utilizing D/A and A/D converters have been difficult to test, due to the previously intractable problem of programmatically generating in-circuit tests for these components.

SUMMARY OF THE INVENTION

The present invention overcomes the disadvantages and limitations of the prior art by providing a device and methodology for the in-circuit functionality testing of analog to digital converters. This is accomplished by: electronically isolating the converter under test from its attendant circuitry (by means of analog and digital overdriving), programmatically stimulating the input port with an appropriate analog waveform, and finally evaluating the converter response by comparing the output bit pattern against expectations. This process is repeated as many times as necessary to completely evaluate the specific converter under test. The device of the present invention may be used effectively to evaluate both high order and low order bits through respective deterministic and non-deterministic bit checks. Testing is thus possible in an electrically noisy test environment, and is independent of the downstream and upstream circuitry surrounding the device under test.

DETAILED DESCRIPTION OF THE INVENTION

Figure 1:
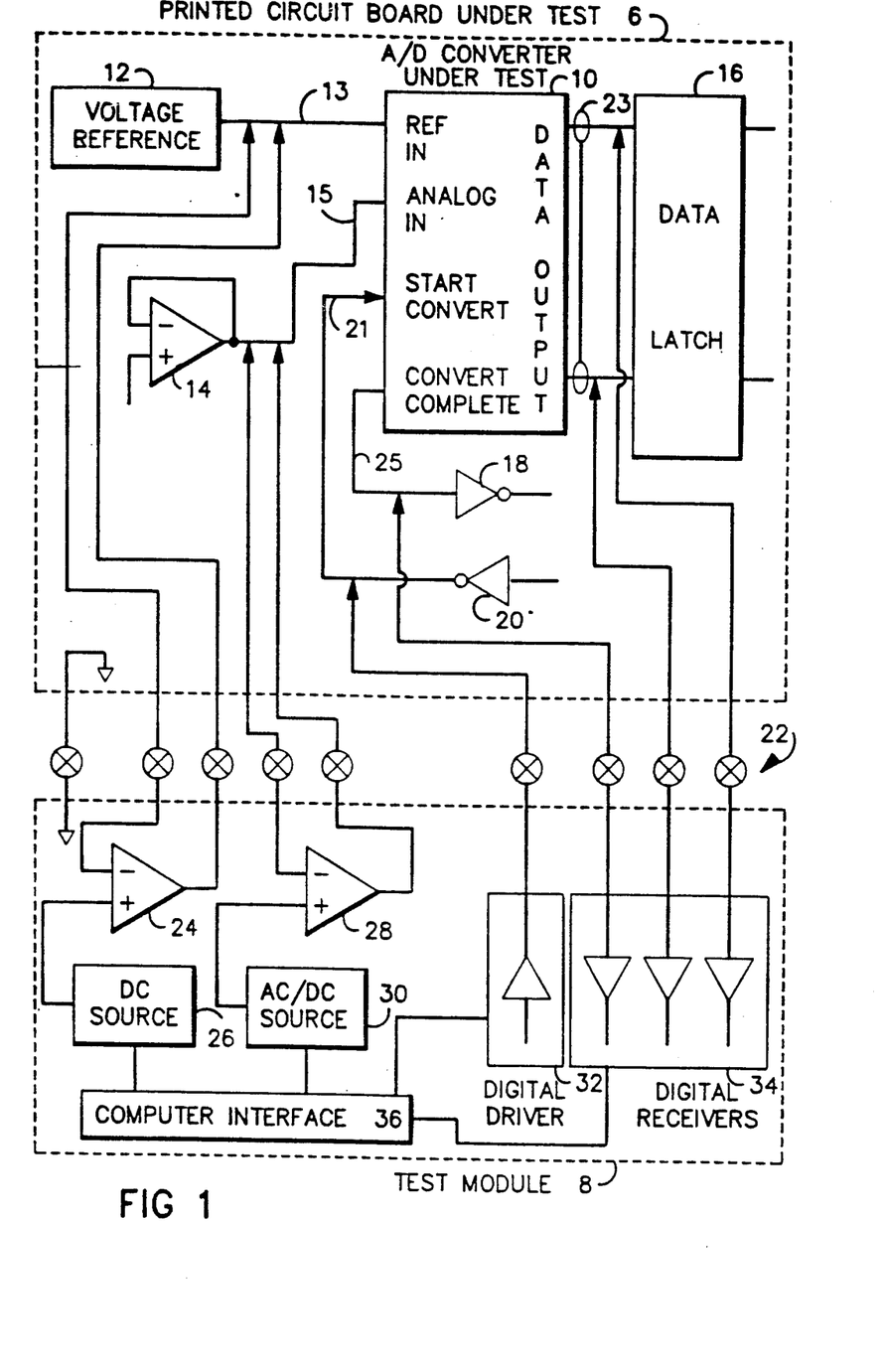
FIG. 1 is a schematic circuit design of a test module for testing an analog to digital converter in a typical printed circuit board configuration in accordance with the present invention.

FIG. 1 discloses the schematic diagram of a test module 8 for performing programmatically generated in-circuit "pin checks" and "gross functionality tests" of an analog to digital converter 10 which is one component of the printed circuit board assembly under test 6. The test module 8 is driven through a computer interface 36 and a test program generated for the specific A/D converter being tested; and is interfaced to the printed circuit board under test 6 through a test fixture and scanner relays 22.

In order to perform an in-circuit test, the test module 8 must isolate the A/D converter 10 under test from all surrounding circuitry, stimulate the converter, and then make appropriate measurements to determine converter functionality. Isolation techniques are provided for digital inputs such as the start convert line 21; as well as for the analog inputs, specifically the reference voltage input 13 and the analog input 15 to the converter. The output measurements are made at the digital outputs 23 of the A/D converter 10 in order to determine the A/D converter's functionality.

All A/D converters require an analog input signal 15 produced by a source such as that schematically illustrated by amplifier 14, and a small percentage require an external voltage reference 13 produced by an on board reference voltage generator 12. In order to isolate the A/D converter 10 from onboard signals produced by 12 and 14, the test module 8 uses analog overdriving as the method to impose voltages determined by the test program directly to A/D converter inputs 13 and 15. In the case of the reference voltage input 13, an analog overdrive amplifier 24 with remote sensing (at its negative input) is combined with a DC voltage source 26 to set the desired voltage level. For the analog input line 15 to A/D converter 10, an analog overdrive amplifier 28 (with remote sensing at its negative input) is combined with a combination AC/DC source 30 to provide the desired waveforms to the A/D converter 10 under test.

The only digital input line requiring isolation and stimulus is the start convert input 21. This signal is applied to the converter under test 10 by means of overdriving digital driver 32 to activate the conversion process. The use of digital overdriving permits the application of this signal directly at the start convert input 21 independent of other digital circuitry 20 on the board under test 6.

The digital overdrive isolation technique is in effect for the duration of the test sequence. This is of concern as digital overdrive testing can result in damage to upstream circuit components (the start convert driver 20 shown in the diagram). However, the test module 8 is designed to permit rapid completion of the test process, and in conjunction with careful test setup and monitoring a test can be generated which is well within the overdrive tolerance of most integrated circuits.

When the isolation and stimulus of analog converter inputs are in place, the conversion process is initiated by means of the start convert line and the test cycle is then completed by measuring the response at the converter output lines 23. This data is collected by means of digital receivers 34 in the test module 8. For most converters, this is a two step process. First, the convert complete line 25, must be monitored for indication that the analog to digital conversion process is complete. When this signal is received, by means of digital receiver 34, the output data may then be read at the A/D converter data outputs 23 again by means of digital receiver 34 for comparison to expected results.

The test module of the present invention supports a number of specific test options which evaluate analog to digital converter functionality. For some converters, a simple "overrange/underrange" test is adequate. This is a fast two pass deterministic test which consists of applying input signals above and below the conversion range of the A/D converter 10 under test. Then, the response at the data output 23, either all "0's" or all "1's" (or equivalent overrange and underrange data) can be measured by the digital receivers 34 and evaluated by the test control program. For converters which do not provide deterministic responses to overrange conditions, a more elaborate test procedure is required. In this case, the evaluation of high order bits (those corresponding to larger voltage changes at the input) can be accomplished in a deterministic fashion by simply setting an appropriate input voltage and measuring bit behavior, as in the above process.

Considerably more difficult however, is the evaluation of the low order bits of the A/D converter (those corresponding to very small changes in the analog input voltage). This measurement problem is aggravated by the electrically noisy test environment resulting from the digital and analog overdriving at the converter inputs. Remote sensing at the reference input 13 and analog input 15 of the device reduce the severity of this problem. In addition, a non-deterministic measurement technique can be used whereby multiple conversion cycles, in response to an AC signal at the analog input, are initiated looking first for a "1" output on a given bit line of interest, and later looking for a "0" output on the same line.

Figure 2:
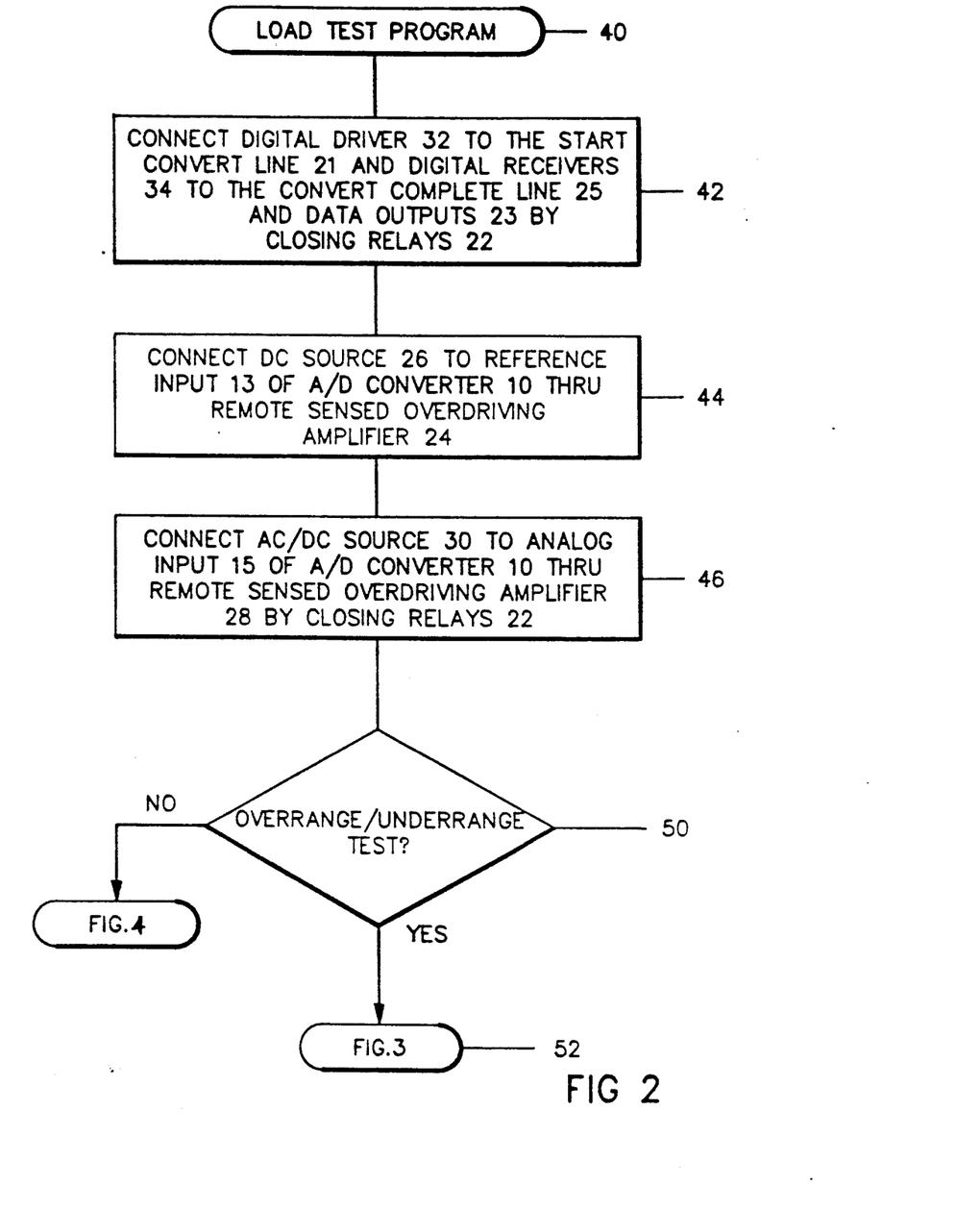
FIG. 2 is a schematic flow diagram of the test setup process for testing a typical analog to digital converter employed in accordance with the present invention.

FIG. 2 discloses a schematic flow diagram of the steps used in setting up an in-circuit "pin check" and "gross functionality test" of an analog to digital (A/D) converter using the test module of FIG. 1. The test setup begins with step 40 by loading the appropriate component test program and making all electrical connections through scanner relays 22 to the circuit board 6 containing the A/D converter 10 under test as shown in FIG. 1. In step 42 the digital driver 32 is connected to the start convert line 21, and digital receivers 34 are connected to the convert complete line 25, and data output ports 23. Next, in step 44, DC source 26 is connected to the reference input 13 of the A/D converter 10 by means of a remotely sensed overdriving amplifier 24. This allows the overdriving of the voltage reference 12, thus imposing the desired voltage at the converter reference input 13. This voltage is left in place for the duration of the test. In step 46, a combined AC/DC source 30 is connected to the analog input 15 of the A/D converter 10 by means of a remote sensed overdriving amplifier 28. This overdrives the onboard analog source 14, thus imposing the desired waveform at the converter input 15 for various test phases.

Figure 3:
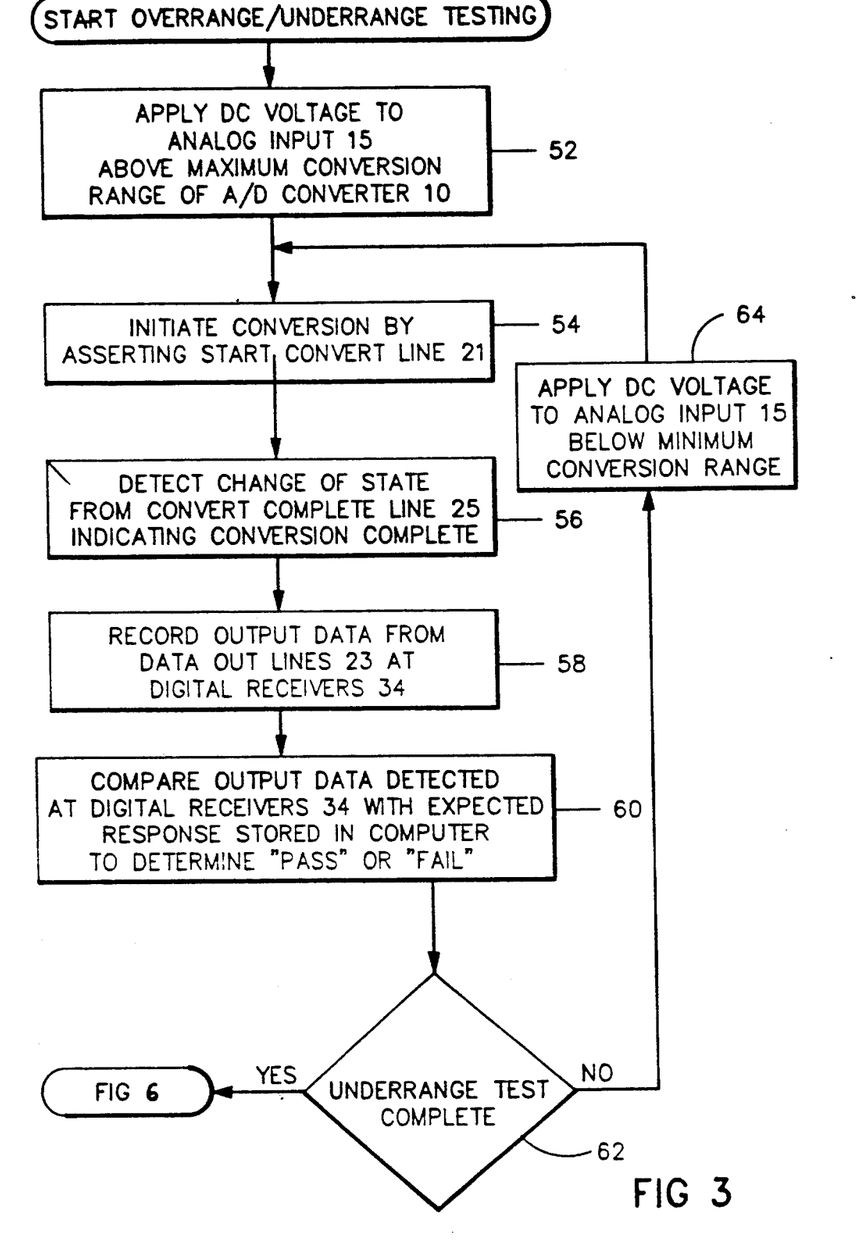
FIG. 3 is a schematic flow diagram of the overrange/underrange test procedure for testing an analog to digital converter employed in accordance with the present invention.

As disclosed in FIG. 3 for the case of A/D converters with deterministic overrange/underrange behavior, an overrange/ underrange test technique is used. This tests all bits of the A/D converter 10 under test—both high and low order. Here, as shown in step 52, a DC voltage above the maximum conversion capability of the converter is first applied to the analog input of the converter by means of the AC/DC voltage source 30 and analog overdrive amplifier 28. The start convert signal is then asserted in step 54 by means of the digital overdriving driver 32. The test module 8 then awaits conversion completion, in step 56, which is sensed by means of the conversion complete line and a digital receiver 34. Once conversion is complete, the data output is read, in step 58, by means of the digital receivers 34. This measured digital response is compared directly to the expected response, in step 60, (all "1's" or an equivalent overrange response) to determine the pass or fail outcome of the test. Then, in step 64, the underrange test (a second pass test) repeating steps 54 through 60 is then conducted by applying a voltage below the minimum conversion capability of the A/D converter 10 verifying all "0's" (or an equivalent underrange indication) at the output 23.

Figure 4:
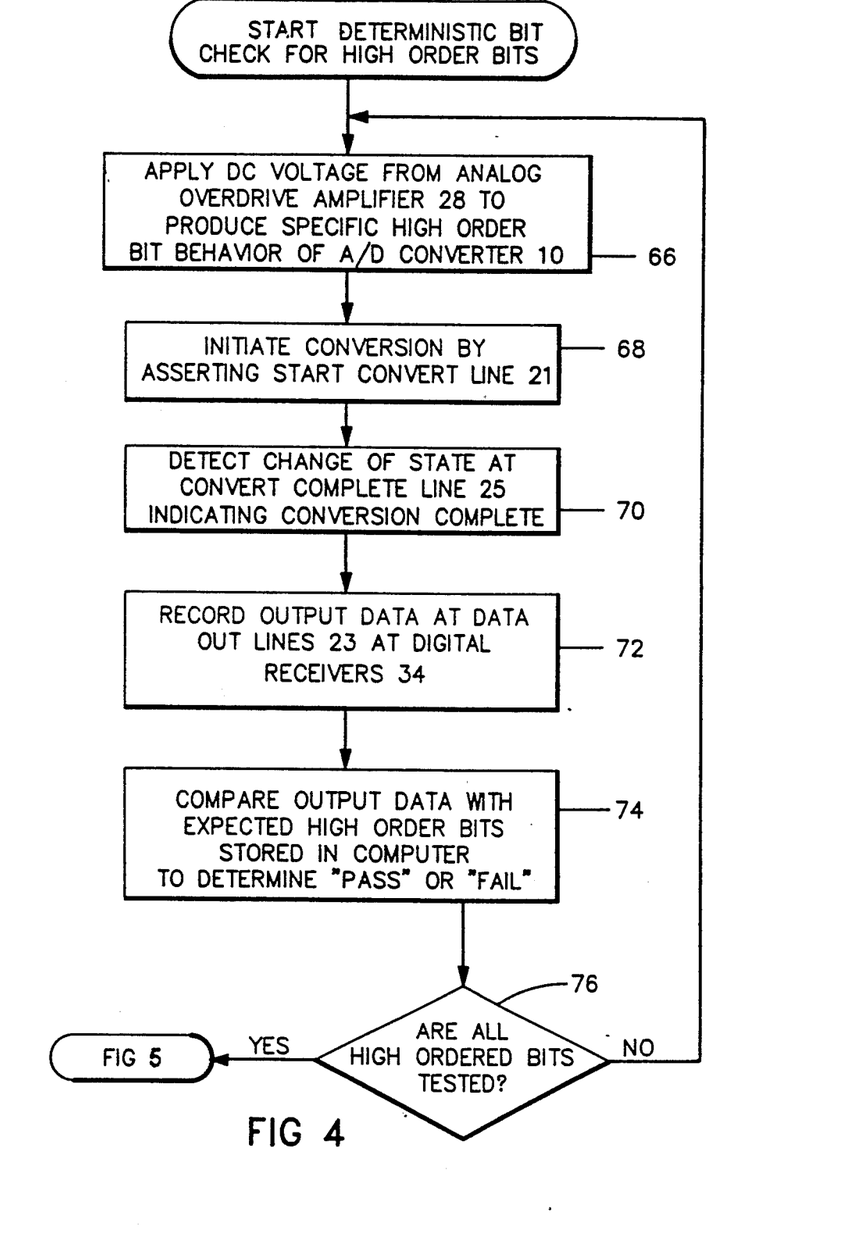
FIG. 4 is a schematic flow diagram of the deterministic test of high order bits of an analog to digital converter employed in accordance with the present invention.

The second deterministic verification option is disclosed in FIG. 4 and applies to converters without predictable overrange/underrange behavior. In this case, a deterministic bit check is used to verify only the performance of the high order bits (those responding to higher levels of analog input signal) of the converter under test 10. These bits are evaluated one by one by applying voltage levels to the converter which will correspond to specific predictable changes in the higher order digital output bits. In step 66, an appropriate DC voltage is applied to the analog input 15 of the A/D converter 10 by means of the AC/DC voltage source 30 and analog overdrive amplifier 28. The start convert signal is then asserted, in step 68, by means of the digital overdriving driver 32. The test module 8 then awaits conversion completion, in step 70, which is sensed by means of the conversion complete line 25 and a digital receiver 34. Once conversion is complete, the data output 23 is read by means of digital receivers 34 in step 72. The measured digital pattern is then compared directly to the expected response, at step 74, in order to determine the pass/fail outcome of the test. This sequence is then repeated under program control until all high order bits of the A/D converter 10 being tested have been deterministically tested in step 76.

Figure 5:
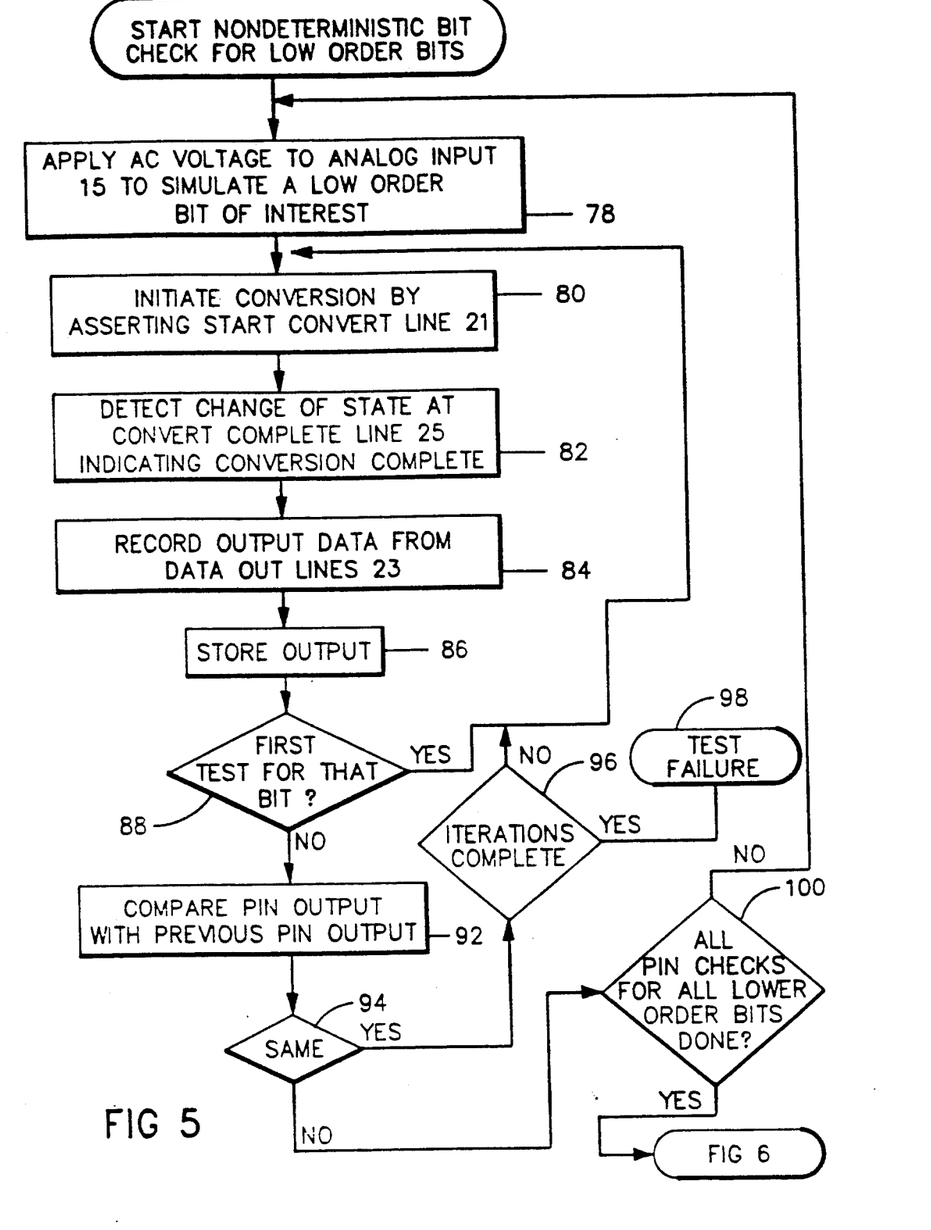
FIG. 5 is a schematic flow diagram of the non-deterministic bit check of low order bits of an analog to digital converter employed in accordance with the present invention.

FIG. 5 discloses the test procedure for the non-deterministic evaluation of lower order bits (those input bits responding to lower levels of voltage at the analog input of the converter). This procedure is used when the electrical noise levels in the test environment prevent absolute correlation between applied analog voltage levels and the lower order bit outputs of the A/D converter 10. This process is not required for converters tested by the overrange/underrange method. In this process, multiple conversion cycles are performed in response to an AC input signal while looking for both a "0" and a "1" output from the same bit. The change in state is used as an indication of bit functionality. For this test an appropriate AC voltage is applied, in step 78, to the analog input 5 of the A/D converter 10 by means of the AC/DC voltage source 30 and analog overdrive amplifier 28. The start convert signal is then asserted, in step 80, by means of the digital overdriving driver 32. The test module 8 then awaits conversion completion—which is sensed, in step 82, by means of the conversion complete line 25 and a digital receiver 34. Once conversion is complete, the data output is read, in step 84, by means of digital receivers 34. This data is logged, in step 86, and the test repeated as required, in steps 88 through 96, until all bits have exhibited both a "1" and a "0" output. Once this occurs, the test is considered to have passed at step 100. A failure 98 is indicated if, after a considerable number of iterations (statistically determined based on the converter specifications) one or more bits is "stuck" in a single state, and is thus considered non-functional.

Figure 6:
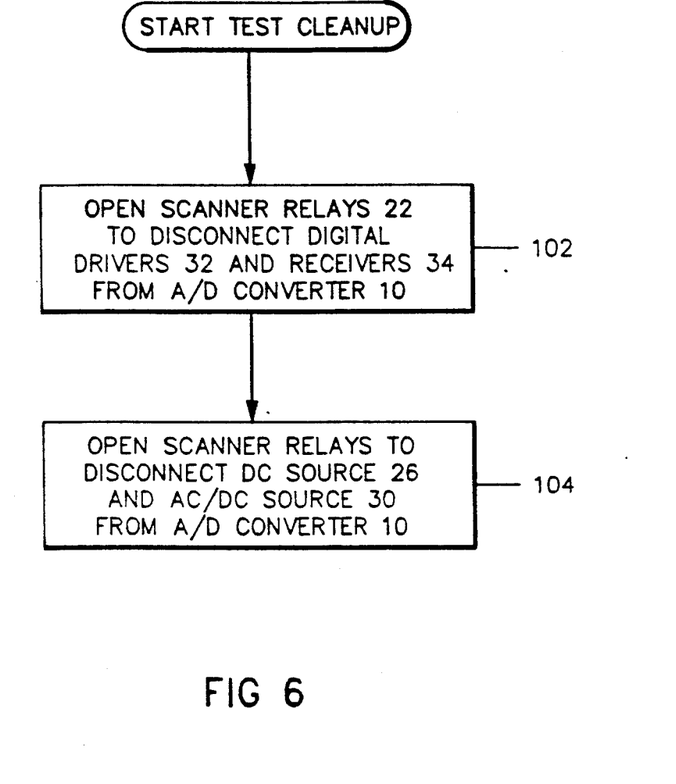
FIG. 6 is a schematic flow diagram of the test cleanup procedure for the test of an analog to digital converter employed in accordance with the present invention.

The choice of overrange testing vs. deterministic and non-deterministic bit verification is set by the specifications and type of A/D converter under test. Also, the crossover point from "low order" bits to "high order" bits is determined by the specifications of the A/D converter under test and is incorporated into the test program so that appropriate test techniques are applied to the specific converter under test. Clean up of the A/D converter test setup is disclosed in FIG. 6. Here, in steps 102 and 104 all lines between the A/D converter 10 under test and the test module 8 are disconnected. This is accomplished by opening scanner relays 22.

The above described procedure cover the test requirements of typical A/D converters. Depending on the exact converter specifications and/or features, this procedure may be truncated into fewer steps in order to increase throughput; or further partitioned into more steps in order to cover other specific requirements.

In the preferred embodiment, the DC source 26 generates a voltage in the range of +/−10.0 volts at a minimum resolution of 3.0 mV and an accuracy of +/−0.1%. The AC/DC source 30 preferably generates a voltage in the range of +/−10.0 volts at a minimum resolution of 3.0 mV with an accuracy of +/−0.1% and, a frequency range of 0.5 Hz to 30 kHz with a resolution of 0.5 Hz and an accuracy of +/−0.5%. The amplifiers 24, 28 preferably provide a minimum output current of 150 mA with a maximum output impedance of 3.0 ohms. The digital drivers 32 preferably generate a voltage in the range of −3.5 to +5.0 volts at a minimum resolution of 5.0 mV, and a current capability of +/−500 mA. The digital receivers 34 preferably receive input voltages in the range from −3.5 to +5.0 volts at a minimum resolution of 5.0 mV and an input loading current of less than 30.0 A.

The present inVention therefore provides a unique means and method of programmatically generating in-circuit gross functionality tests of analog to digital converters independent of the circuit in which the converter resides. The present invention therefore provides a method of quality control in the manufacture of printed circuit boards containing these hybrid devices.

The forgoing description of the invention has been presented for purposes of illustration and description. It is not intended to be exhaustive or to limit the invention to precisely the form disclosed, as other modifications and variations may be possible in light of the above teachings The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except as limited by the prior art.

What is claimed is:

1. A module for programmatic testing of an analog to digital converter (A/D) that is connected to components in a circuit, the module comprising:
   first voltage generator means for generating a precision direct current signal;
   second voltage generator means for generating a combined direct current and alternating current signal;
   overdriving amplifier means operatively coupled to receive the signals generated by said first and second voltage generator means for amplifying said precision direct current signal and said combined direct current and alternating current signal by an amount sufficient to isolate and stimulate said analog to digital converter from said components in said circuits;
   overdriving digital driver means for stimulating the start convert input of the analog digital converter under test for activating said analog to digital converter;
   digital receiver means for receiving a convert complete signal and measuring output data from said analog to digital converter;
   comparator means for comparing said output data with an expected response signal generated externally of said circuit;
   said testing comprising analysis of the result of the comparison of said output data with said expected response signal.

2. The module of claim 1 wherein said first voltage generator means comprises:
   means for generating a range of +/−10.0 volts at a minimum resolution of 3.0 mV and an accuracy of +/−0.1%.

3. The module of claim 1 wherein said second voltage generator means comprises:
   means for generating a range of +/−10.0 volts at a minimum resolution of 3.0 mV and an accuracy of +/−0.1% and, a frequency range of 0.5 Hz to 30 kHz with a resolution of 0.5 Hz and an accuracy of +/−0.5%.

4. The module of claim 1 wherein said overdriving amplifier means comprises:
   means for generating a minimum output current of 150 mA with maximum output impedance of 3.0 ohms.

5. The module of claim 1 wherein said overdriving digital driver means comprises:
   means for generating a range of −3.5 to 5.0 volts at a minimum resolution of 5.0 mV, and current capability of +/−500 mA.

6. The module of claim 1 wherein said digital receiver means comprises:

means for receiving an input voltage range of −3.5 to 5.0 volts at a minimum resolution of 5.0 mV and an input loading current of less than 30.0 uA.

7. A process to programmatically perform in-circuit pin checks and gross functionality tests of analog to digital converters using overrange/underrange deterministic bit evaluation techniques comprising the steps of:

(a) isolating an analog to digital converter to be tested in the circuit from surrounding circuitry;

(b) applying a DC voltage above a maximum conversion range of said analog to digital converter to perform overrange test;

(c) applying a DC voltage below a minimum conversion range of said analog to digital converter to perform underrange test;

(d) analyzing the results of steps (b) and (c) to determine a pass/fail status of said analog to digital converter.

8. The process of claim 7 further comprising the steps of:

connecting a precision DC source through a first analog overdriving amplifier to the reference input of the analog to digital converter under test, the first analog overdriving amplifier having a remote sense input;

connecting a combined AC/DC source through a second analog overdriving amplifier to the reference analog signal input of the analog to digital converter under test, the second analog overdriving amplifier having a remote sense input;

connecting said remote sense inputs of said first and second analog overdriving amplifier to the reference input and analog signal input, respectively, of the analog to digital converter under test;

connecting an overdriving digital driver to the start convert input of said analog to digital converter;

connecting digital receivers to the convert complete and data output lines of said analog to digital converter; and, performing steps (a)-(d).

9. The process of claim 7 wherein said overrange/underrange tests further comprise the steps of:

applying said overrange DC voltage to an analog input of said analog to digital converter;

starting a conversion sequence by stimulating a start convert line to said analog to digital converter with said digital driver;

waiting for conversion completion as indicated by a convert complete signal read by said digital receivers;

evaluating a conversion data output read by said digital receivers for a predicted overrange output of the analog to digital converter under test;

applying said underrange DC voltage to an analog input of said analog to digital converter;

starting a conversion sequence by asserting a start convert line to said analog to digital converter with said digital driver;

waiting for a conversion completion to be indicated by a convert complete signal of said analog to digital converter as sensed by said digital receiver;

measuring an output of said A/D converter with said digital receivers to evaluate an expected underrange response.

10. A process to programmatically perform in-circuit pin checks and gross functionality tests of analog to digital converters comprising the steps of:

(a) performing a deterministic bit evaluation of high order bits by applying DC voltage to produce specific high order bit outputs of said analog to digital converter;

(b) determining a pass/fail status of the analog to digital converter based upon said deterministic bit evaluation;

(c) performing a non-deterministic bit evaluation of low order bits by applying specific alternating voltages to produce varying low order bit outputs of said analog to digital converter; and, (d) statistically evaluating the low order bits and determining a pass/fail status of the analog to digital converter based upon said non-deterministic bit evaluation.

11. The process of claim 10 further comprising the steps of:

connecting a precision DC source through a first analog overdriving amplifier to the reference input of the analog to digital converter said first analog overdriving amplifier having a remote sense input;

connecting a combined AC/DC source through a second analog overdriving amplifier to an analog signal input of said analog to digital converter, said second analog overdriving amplifier having a remote sense input;

connecting the remote sense inputs of the first and second analog overdriving amplifiers to the reference input and analog signal input, respectively, of said analog to digital converter;

connecting an overdriving digital driver to a start convert input of said analog to digital converter;

connecting digital receivers to a convert complete and data output lines of the analog to digital converter under test; and, performing steps (a)-(b).

12. The process of claim 10 wherein said deterministic bit evaluation of high order bits further comprises:

applying said specific DC voltage signal to analog input of said A/D converter to generate a specific resultant high order bit at the output of said analog to digital converter;

starting the conversion sequence by asserting the start convert line of analog to digital converter under test with said digital driver;

waiting for conversion completion as indicated by a digital receiver connected to convert complete line of said analog to digital converter;

reading output data from said analog to digital converter with said digital receivers;

evaluating said measured data against expected response for said input signal;

repeating the proceeding four steps to test all high order bits of analog to digital converter.

13. The process of claim 10, wherein said non-deterministic evaluation of low order bits further comprises:

applying said appropriate AC signal to the analog input of said analog to digital converter for duration of said test;

starting conversion by asserting a start convert line to said analog to digital converter under test with said digital driver;

waiting for a convert complete signal from said analog to digital converter as indicated by a digital receiver connected to convert complete line of said analog to digital converter; test;

logging conversion data and repeating above steps until bit under observation exhibits both a "0" and a "1" output;

repeating the immediately preceding four steps to test all low order bits for said analog to digital converter.

* * * * *